US008969151B2

(12) United States Patent
Tan et al.

(10) Patent No.: US 8,969,151 B2
(45) Date of Patent: Mar. 3, 2015

(54) INTEGRATED CIRCUIT SYSTEM EMPLOYING RESISTANCE ALTERING TECHNIQUES

(75) Inventors: Shyue Seng Tan, Singapore (SG); Lee Wee Teo, Singapore (SG); Chung Foong Tan, Singapore (SG); Jae Gon Lee, Singapore (SG); Elgin Kiok Boone Quek, Singapore (SG)

(73) Assignee: GLOBALFOUNDRIES Singapore Pte. Ltd., Singapore (SG)

(*) Notice: Subject to any disclaimer, the term of this patent is extended or adjusted under 35 U.S.C. 154(b) by 1300 days.

(21) Appl. No.: 12/040,761

(22) Filed: Feb. 29, 2008

(65) Prior Publication Data
US 2009/0221117 A1 Sep. 3, 2009

(51) Int. Cl.
H01L 21/8234 (2006.01)
H01L 21/8244 (2006.01)
H01L 27/06 (2006.01)
H01L 21/8238 (2006.01)
H01L 29/78 (2006.01)
H01L 21/00 (2006.01)

(52) U.S. Cl.
CPC .... H01L 27/0629 (2013.01); H01L 21/823807 (2013.01); H01L 29/7847 (2013.01)
USPC ............................................ 438/238; 438/50

(58) Field of Classification Search
USPC .................................... 438/50, 238
See application file for complete search history.

(56) References Cited

U.S. PATENT DOCUMENTS

| | | | | |
|---|---|---|---|---|
| 4,406,051 A * | 9/1983 | Iizuka | .......................... | 438/238 |
| 5,980,025 A * | 11/1999 | Burke et al. | .................... | 347/62 |
| 6,436,747 B1 * | 8/2002 | Segawa et al. | ................ | 438/197 |
| 6,645,803 B1 * | 11/2003 | Kalnitsky et al. | ............. | 438/238 |
| 6,730,554 B1 | 5/2004 | Baldwin et al. | | |
| 6,811,448 B1 * | 11/2004 | Paton et al. | ................... | 439/706 |
| 6,864,135 B2 | 3/2005 | Grudowski et al. | | |
| 6,936,520 B2 | 8/2005 | Yamanoue et al. | | |
| 2004/0097032 A1 * | 5/2004 | Yamanoue et al. | ........... | 438/238 |
| 2006/0202277 A1 * | 9/2006 | Hierlemann et al. | ......... | 257/369 |
| 2007/0161143 A1 * | 7/2007 | Kim | ................. | 438/57 |
| 2007/0267685 A1 * | 11/2007 | Ishibashi | ....................... | 257/316 |
| 2008/0003734 A1 * | 1/2008 | Chuang et al. | ................ | 438/199 |

OTHER PUBLICATIONS

C. Ortolland, P. Morin, C. Chaton, E. Mastromatteo, C. Populaire, S. Orain, F. Leverd, P. Stolk, F. Boeuf & F. Arnaud, Stress Memorization Technique (SMT) Optimization for 45nm CMOS, 2006 Symposium on VLSI Technology Digest of Technical Papers, Posted on line:Oct. 2, 2006 08:15:12.0, pp. 78-79, Honolulu, HI.
Pierre Morin, Francois Wacquant, Marc Juhel, Cyrille Laviron, & D. Lenoble, Influence of the spacer dielectric processes on PMOS junction properties, Materials Science and Engineering: B, Aug. 31, 2005, pp. 319-322,vol. 124(1), Elsevier publishing company, France.

* cited by examiner

*Primary Examiner* — Calvin Choi
(74) *Attorney, Agent, or Firm* — Ishimaru & Associates LLP

(57) ABSTRACT

An integrated circuit system that includes: providing a substrate including a first region and a second region; forming a first device over the first region and a resistance device over the second region; forming a first dielectric layer and a second dielectric layer over the substrate; removing a portion of the second dielectric layer; and annealing the integrated circuit system to remove dopant from the resistance device.

20 Claims, 7 Drawing Sheets

INTEGRATED CIRCUIT SYSTEM EMPLOYING RESISTANCE ALTERING TECHNIQUES

TECHNICAL FIELD

The present invention relates generally to integrated circuits, and more particularly to an integrated circuit system employing resistance altering techniques.

BACKGROUND ART

Integrated circuits find application in many of today's consumer electronics, such as cell phones, video cameras, portable music players, printers, computers, etc. Integrated circuits may include a combination of active devices, passive devices and their interconnections.

Mixed-signal, logic and RF integrated circuits often contain resistors to exert a desired control over current in a particular part of an electronic circuit. To achieve a particular resistance value within a resistor, a circuit designer typically modifies the length and/or width of the resistor material because, as is well known in the art, resistance is directly related to the length of the resistor and inversely related to the width of the resistor. Moreover, it is desirable to manufacture the resistor from a material with a high sheet resistance value because resistance is directly related to sheet resistance. Fortunately, for the semiconductor industry intrinsic silicon, which possesses a resistivity of about $2.5 \times 10^5$ ohms-cm, can be altered through the introduction of dopants to obtain a desired resistivity or conductivity.

Accordingly, extrinsic poly-silicon is typically used to form resistors, not only because the resistivity of the resistor can be precisely controlled by introducing dopants, but also because resistors can be concurrently formed from the same poly-silicon layer that forms the gate structures of adjacent active devices. Unfortunately, concurrent formation requires additional special process steps to alter the resistivity of the resistor, such as shallow implants with reduced doping concentration and reduced thermal budgets. However, these special process steps inevitably degrade the poly-depletion effect and transistor performance.

Thus, a need still remains for a reliable integrated circuit system and method of fabrication, wherein the integrated circuit system includes a high resistance resistor without degrading transistor performance. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit system including: providing a substrate including a first region and a second region; forming a first device over the first region and a resistance device over the second region; forming a first dielectric layer and a second dielectric layer over the substrate; removing a portion of the second dielectric layer; and annealing the integrated circuit system to remove dopant from the resistance device.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
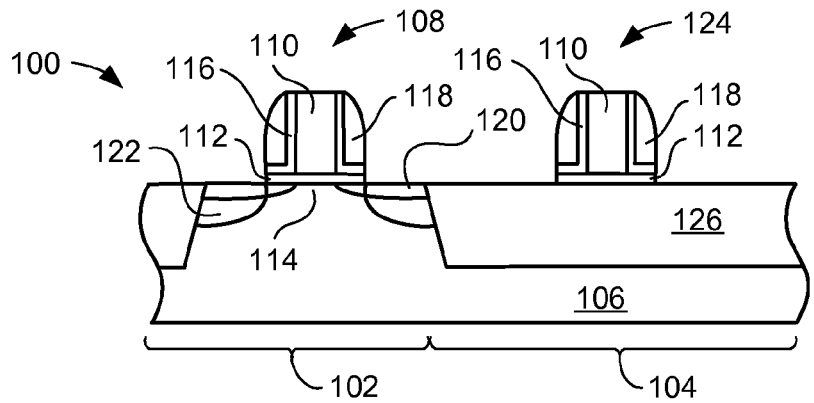
FIG. 1 is a partial cross sectional view of an integrated circuit system in an initial stage of manufacture in accordance with an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGS. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

The term "on" is used herein to mean there is direct contact among elements.

The terms "example" or "exemplary" are used herein to mean serving as an instance or illustration. Any aspect or embodiment described herein as an "example" or as "exemplary" is not necessarily to be construed as preferred or advantageous over other aspects or designs.

The terms "first" and "second" as used herein are for purposes of differentiation between elements only and are not to be construed as limiting the scope of the present invention.

The term "system" as used herein means and refers to the method and to the apparatus of the present invention in accordance with the context in which the term is used.

The term "exhibiting the characteristics of stress memorization" as used herein includes a structure or element that has its physical properties affected by a stress memorization layer.

Generally, the following embodiments relate to the formation of a resistor including, but not limited to, a high resistance resistor within an integrated circuit system. In some embodiments, the resistor can be manufactured by utilizing strategically engineered dielectric layers that block the deposition of low resistance electrical contacts, while promoting the out-diffusion of dopants from within the resistor. In other embodiments, a hydrogen doping process can be employed in conjunction with the strategically engineered dielectric layers to further enhance the out-diffusion of dopants from within the resistor. In yet other embodiments, the strategically engineered dielectric layers can also induce stress memorization within adjacent active device structures, thereby enhancing active device performance.

FIGS. 1-8, which follow, depict by way of example and not by limitation, an exemplary process flow for the formation of an integrated circuit system and they are not to be construed as limiting. It is to be understood that a plurality of conventional processes that are well known within the art and not repeated herein, may precede or follow FIGS. 1-8. Moreover, it is to be understood that many modifications, additions, and/or omissions may be made to the below described process without departing from the scope or spirit of the claimed subject matter. For example, the below described process may include more, fewer, or other steps. Additionally, steps may be performed in any suitable order without departing from the scope of the present invention.

Moreover, it is to be appreciated that the integrated circuit system of the present disclosure may include any number of multi-electrode devices in which the current flowing between two specified electrodes is controlled or modulated by the voltage applied at a control electrode. Exemplary illustrations may include an n-channel field effect transistor (NFET), a p-channel field effect transistor (PFET), a complementary metal-oxide-silicon (CMOS) configuration, a single-gate transistor, a multi-gate transistor, a fin-FET, or an annular gate transistor. Additionally, it is to be understood that the integrated circuit system of the present disclosure may include any number of resistance devices with varying resistance values formed by strategically altering the process techniques described herein. Furthermore, it is to be understood that one or more of the integrated circuit system could be prepared at one time on a medium, which could be separated into individual or multiple integrated circuit assemblies at a later stage of fabrication.

Referring now to FIG. 1, therein is shown a partial cross sectional view of an integrated circuit system 100 in an initial stage of manufacture in accordance with an embodiment of the present invention. The integrated circuit system 100 includes a first region 102 and a second region 104. In some embodiments, the first region 102 may include active and passive devices and the second region 104 may include passive devices. In other embodiments, the first region 102 may include, more particularly, any number of multi-electrode devices in which the current flowing between two specified electrodes is controlled or modulated by the voltage applied at a control electrode and the second region 104 may include, more particularly, any number of resistance devices with varying resistance values formed by strategically altering the process techniques described herein. It is to be understood that the integrated circuit system 100 can be used within processor components, memory components, logic components, digital components, analog components, mixed-signal components, power components, radio-frequency (RF) components (e.g., RF CMOS circuits), digital signal processor components, micro-electromechanical components, optical sensor components, and so forth, in numerous configurations and arrangements as may be needed.

The first region 102 and the second region 104 are formed within or over a substrate 106. By way of example, the substrate 106 may include any semiconducting material, such as, Si, SiC, SiGe, Si/SiGe, SiGeC, Ge, GaAs, InAs, InP, other III/V or II/VI compound semiconductors, as well as silicon-on-insulator configurations. Additionally, the substrate 106 may also include doped and undoped configurations, epitaxial layers, strained configurations, and one or more crystal orientations (e.g.—<100>, <110>, and/or <111> orientations), which may be strategically employed to optimize carrier mobility within NFET and PFET devices. The substrate 106 may also include any material that becomes amorphous upon implantation.

In some embodiments, the substrate 106 may possess a thickness ranging from about one hundred (100) nanometers to about several hundred microns, for example.

However, the examples provided for the substrate 106 are not to be construed as limiting and the composition of the substrate 106 may include any material, configuration, or thickness that physically and electrically enables the formation of active and/or passive device structures.

A first device 108 can be formed over, on and/or within the substrate 106 by conventional deposition, patterning, photolithography, and etching techniques known in the semiconductor processing industry for the manufacture of active and/or passive devices. In some embodiments, the first device 108 may include one or more of a PFET device, an NFET device, and/or a combination thereof (i.e.—a CMOS device), even though only one of the first device 108 is depicted.

In general, the first device 108 includes a gate 110, a gate dielectric 112 under the gate 110, a channel 114, a liner 116, a spacer 118, a source/drain extension 120, and a source/drain 122.

In some embodiments, the gate 110 may be formed from conventional materials including doped and undoped semiconducting materials (such as, for example, polySi, amorphous Si, or SiGe), a metal, a metallic alloy, a silicide, or a combination thereof, for example. In other embodiments, the gate 110 may also include any conducting material or composition that becomes amorphous upon implantation. The gate dielectric 112 may be made from materials including, but not limited to, silicon oxide, silicon oxynitride, silicon nitride, a silicon oxide/nitride/oxide stack, a high-k dielectric material (i.e.—one having a dielectric constant value greater than silicon oxide), or a combination thereof. However, it is to be understood that the type of material chosen for the gate dielectric 112 is not limited to the above examples; for example, the gate dielectric 112 may include any material that permits induction of a charge in the channel 114 when an appropriate voltage is applied to the gate 110. Accordingly, other materials, which may be known to those skilled in the art for gate structures, may also be used for the gate 110 and the gate dielectric 112.

Generally, the thickness of the gate 110 is between about 500 angstroms and about 3000 angstroms and the thickness of the gate dielectric 112 is between about 10 angstroms and about 50 angstroms. However, larger or smaller thicknesses of the gate 110 and the gate dielectric 112 may be appropriate depending on the design specifications of the first device 108.

The liner 116 may include dielectric materials such as an oxide, a nitride, or a combination thereof, but preferably includes silicon dioxide. The spacer 118 may also be formed from conventional dielectric materials such as an oxide, a nitride, or a combination thereof, but preferably includes silicon nitride. However, it is to be understood that the type of materials chosen for the liner 116 and the spacer 118 are not limited to the above examples and may include any material that permits electrical isolation of the gate 110 and formation of the source/drain 122 aligned to the spacer 118. Moreover, it is to be understood that the thickness for each of the liner 116 and the spacer 118 will vary with the design specifications of the first device 108.

The first device 108 may also include the source/drain extension 120 and the source/drain 122 formed adjacent the gate 110. In general, the source/drain extension 120 may be formed to a shallow depth with a low concentration of impurities relative to the source/drain 122. More specifically, the source/drain extension 120 may include a dopant concentration between about $1\times10^{16}$ ions/cm$^3$ to about $1\times10^{22}$ ions/cm$^3$. However, larger or smaller concentrations may be used depending upon the impurity used and the design specifications of the first device 108. The impurities used to form the source/drain extension 120 may include n-type or p-type, depending on the first device 108 being formed (e.g., n-type impurities for an NMOS device and p-type impurities for a PMOS device). It is to be understood that the source/drain extension 120 can be formed by aligning the source/drain extension 120 to the gate 110 (i.e., before forming the liner 116 and the spacer 118) or subsequent to forming the liner 116 and the spacer 118 by employing an angled implant.

In some embodiments the source/drain 122 can be aligned to the spacer 118. In general, the source/drain 122 may be of the same conductivity type as the dopants used to form the source/drain extension 120 (e.g., n-type impurities for an NMOS device and p-type impurities for a PMOS device). Exemplary energies and concentrations used to form the source/drain 122 may include an energy between about 1 keV and about 150 keV and a concentration between about $1\times10^{16}$ ions/cm$^3$ to about $1\times10^{22}$ ions/cm$^3$. However, larger or smaller energies and concentrations may be used depending upon the impurity used and the design specifications of the first device 108.

In yet other embodiments, the implant energy used to form the source/drain 122 must possess sufficient energy to amorphize at least a portion of the substrate 106 and/or at least a portion of the gate 110 of the first device 108. An implant with sufficient energy to amorphize at least a portion of the substrate 106 and/or at least a portion of the gate 110 allows a subsequent anneal step to transfer/memorize a stress to the gate 110 and the source/drain 122 during recrystallization, thereby promoting stress within the channel 114 and improving active device performance.

In some embodiments, a resistance device 124 can be formed over, on and/or within the substrate 106 by conventional deposition, patterning, photolithography, and etching techniques known in the semiconductor processing industry for the manufacture of active/passive devices. More specifically, the resistance device 124 can be formed over an isolation structure 126, such as a shallow trench isolation structure, which can electrically isolate and/or separate the resistance device 124 from the first device 108. For purposes of illustration, the isolation structure 126 may be made from a dielectric material such as silicon dioxide ("SiO$_2$") In some embodiments, the resistance device 124 may include a high resistance resistor, such as one with a resistance value exceeding 500 ohms/square.

The structure of the resistance device 124 is substantially similar to the first device 108 and includes the gate 110, the gate dielectric 112, the liner 116, and the spacer 118, thereby enabling concurrent formation of the resistance device 124 with the first device 108 on the substrate 106. It is noted that the layers, structures and process steps corresponding to similar reference numbers generally include the same characteristics (e.g., composition, thickness, function, process techniques, etc.) as those described in reference to the first device 108, and, therefore, their descriptions are not reiterated in detail.

In some embodiments, the gate 110 of the resistance device 124 may be exposed to the dopant implant process used to form the source/drain 122 and/or the source/drain extension 120, thereby adversely altering the resistance of the resistance device 124 (i.e., lowering the desired resistance value of the resistance device 124 below the design specifications of the integrated circuit system 100). For example, the resistance device 124 may include a heavily p-type doped (i.e.—p+) resistor, wherein the p-type dopant concentration within the gate 110 includes a concentration between about $1\times10^{16}$ ions/cm$^3$ to about $1\times10^{22}$ ions/cm$^3$. However, larger or smaller concentrations may be used depending upon the impurity used and the design specifications of the resistance device 124.

It is to be understood that the resistance device 124 operates according to what is conventionally known in the art.

Figure 2:
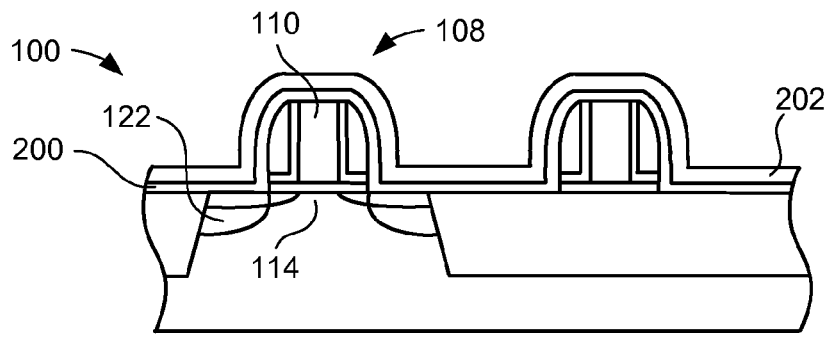
FIG. 2 is the structure of FIG. 1 after forming a first dielectric layer and a second dielectric layer.

Referring now to FIG. 2, therein is shown the structure of FIG. 1 after forming a first dielectric layer 200 and a second dielectric layer 202. The first dielectric layer 200 can be formed over or on the integrated circuit system 100. In some embodiments, the first dielectric layer 200 includes an insulating material such as an oxide grown by wet or dry oxidation techniques. In other embodiments, the first dielectric layer 200 may include an oxide deposited by chemical vapor deposition techniques. In yet other embodiments, the first dielectric layer 200 may include a low temperature oxide film deposited by reacting silane with either oxygen, nitrous oxide, or carbon dioxide at temperatures below about 800° C. in a plasma. In still yet other embodiments, the first dielectric layer 200 may include any oxide that is deposited using temperatures, pressures, and reactants to maximize the hydrogen concentration trapped within the first dielectric layer 200, as described in FIG. 5. By way of example, the first dielectric layer 200 may have a thickness ranging from about 50 angstroms to about 300 angstroms.

Subsequent to forming the first dielectric layer 200, the second dielectric layer 202 can be formed over or on the first dielectric layer 200. In some embodiments, the second dielectric layer 202 includes an insulating material such as a nitride deposited by low pressure chemical vapor deposition (LPCVD) or plasma enhanced chemical vapor deposition (PECVD). In other embodiments, the first dielectric layer 200 may include a silicon nitride film deposited by rapid thermal chemical vapor deposition (RTCVD). In yet other embodiments, the second dielectric layer 202 may include any nitride that is deposited using temperatures, pressures, and reactants to maximize or increase the hydrogen concentration trapped within the second dielectric layer 202. In still yet other embodiments, the second dielectric layer 202 may include any nitride that is deposited using temperatures, pressures, and reactants to maximize or increase the density of the second dielectric layer 202, as described in FIG. 3. In general, the second dielectric layer 202 may have a thickness ranging from about 200 angstroms to about 700 angstroms.

In additional embodiments, the second dielectric layer 202 may also include any material, such as a stress memorization material/layer, that transfers its inherent or intrinsic stress to the gate 110, the channel 114, and/or the source/drain 122 of the first device 108 during an anneal step. In general, when the second dielectric layer 202 includes the characteristics of a stress memorization layer, the second dielectric layer 202 can transfer its intrinsic stress to the first device 108 upon recrystallization of the amorphous regions within the first device 108. By way of example, the second dielectric layer 202 may include a compressively stressed layer or a tensile stressed layer.

It is to be understood that the stress induced within the first device 108 by the second dielectric layer 202 can be increased by increasing the intrinsic stress within the second dielectric layer 202. For example, a multitude of deposition parameters, such as reactant flow rates, pressure, temperature, RF power, reactant materials, and thickness, can be adjusted to modulate the intrinsic stress within the second dielectric layer 202 and thereby maximize its stress transference effect upon the first device 108. In an embodiment, the second dielectric layer 202 may include a silicon nitride layer deposited by a plasma enhanced chemical vapor deposition process.

Moreover, it is to be understood that the second dielectric layer 202 can be strategically designed to exhibit the characteristics of increased density, increased hydrogen concentration, and stress memorization transference.

Figure 3:
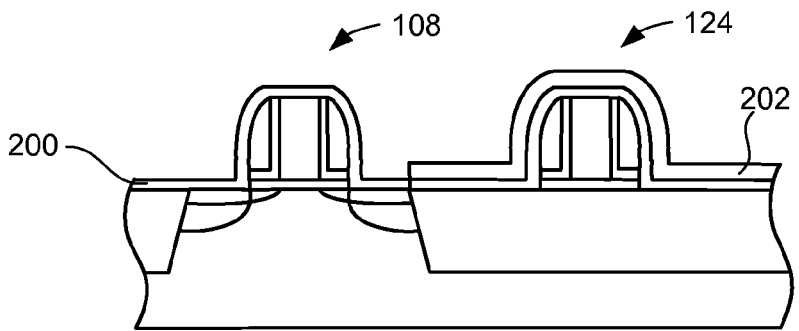
FIG. 3 is the structure of FIG. 2 after removing a second dielectric layer from over a first device.

Referring now to FIG. 3, therein is shown the structure of FIG. 2 after removing the second dielectric layer 202 from over the first device 108. In some embodiments, the second dielectric layer 202 can be removed from over the first device 108 by forming a mask layer (not shown) over the resistance device 124 and etching the remaining exposed portion of the second dielectric layer 202 by methods selective to the composition of the second dielectric layer 202. In such cases, the second dielectric layer 202 can be etched by common gas chemistries such as $CF_4$, $SiF_4$, $NF_3$, $CHF_3$ and $C_2F_6$. In other cases, the second dielectric layer 202 can be removed by any dry etching process that removes a nitride material. However, it is to be understood that the type of gas chemistry used to etch the second dielectric layer 202 is not essential, what is important is that the second dielectric layer 202 is removed from over the first device 108 after etching.

Subsequent to removing the mask layer and the second dielectric layer 202 from over the first device 108, an anneal step is performed to electrically activate the dopants within the first device 108. It is to be understood that the anneal step may include any thermal process that electrically activates the dopants within the first device 108, such as a rapid thermal anneal, a spike anneal and/or a laser anneal.

Notably, the present inventors have discovered that by not removing the second dielectric layer 202 from over the resistance device 124 that the sheet resistance value of the resistance device 124 can be increased by about 40% to about 70% over that of a resistor formed without the second dielectric layer 202. By way of example, the present inventors have discovered that the sheet resistance value of the resistance device 124 can be increased by about 40% to about 70% by increasing the density of the second dielectric layer 202. It is to be understood that the density of the second dielectric layer 202 can be increased by strategically altering the deposition parameters and the deposition methods used to form the second dielectric layer 202.

Accordingly, the present inventors have discovered a method for easily modulating the resistance of the resistance device 124 by altering the density of the second dielectric layer 202 that does not require additional process steps. Not wishing to be limited to any particular theory, the present inventors believe that the increase in resistance of the resistance device 124 is due in part to the ability of the second dielectric layer 202 to prevent hydrogen flushing or out-gassing from the first dielectric layer 200. It is to be understood that as the density of the second dielectric layer 202 increases, its ability to block the diffusion or out-gassing of hydrogen is also increased. It is believed that the hydrogen trapped by the second dielectric layer 202 causes out-diffusion and deactivation of the dopant within the resistance device 124. More specifically, the hydrogen trapped within the first dielectric layer 200 adjacent the resistance device 124 can cause boron, for example, within the resistance device 124 to out-gas and become deactivated upon binding to the hydrogen, thereby increasing the resistance of the resistance device 124.

Figure 4:
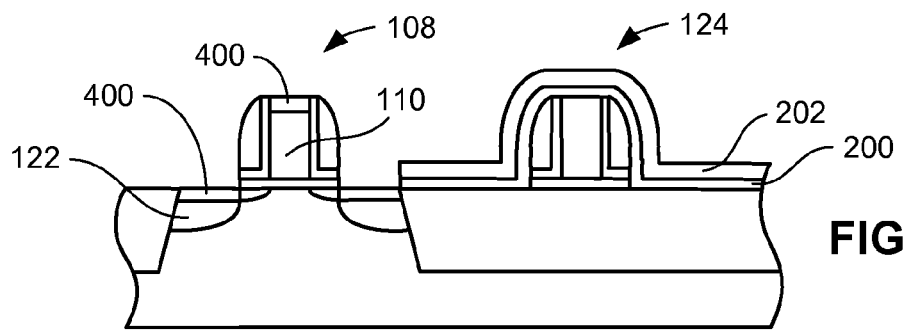
FIG. 4 is the structure of FIG. 3 after removing a first dielectric layer from over a first device.

Referring now to FIG. 4, therein is shown the structure of FIG. 3 after removing the first dielectric layer 200 from over the first device 108. In some embodiments, the first dielectric layer 200 can be removed from over the first device 108 by forming a mask layer (not shown) over the resistance device 124 and etching the remaining exposed portion of the first dielectric layer 200. In such cases, the first dielectric layer 200 can be etched by common wet or dry etch chemistries or a salicide preclean process. However, it is to be understood that the type of etch chemistry used to etch the first dielectric layer 200 is not essential, what is important is that the first dielectric layer 200 is removed from over the first device 108 after etching.

Subsequent to removing the first dielectric layer 200 from over the first device 108, an electrical contact 400, such as a low resistance silicide or salicide electrical contact, can be formed over the gate 110 and the source/drain 122 of the first device 108 by processes well known within the art for forming the electrical contact 400. It is to be understood that the first dielectric layer 200 and the second dielectric layer 202 remaining over the resistance device 124 prevents and/or blocks the deposition of a low resistance silicide electrical contact (i.e., the electrical contact 400), thereby preventing a lowering of the resistance of the resistance device 124.

It is to be understood that the above process steps form a high resistance resistor by blocking the formation of a silicide contact from forming on the resistance device 124 and by removing dopants from the resistance device 124. In some embodiments, the resistance device 124 formed by the above process steps may include a high resistance resistor, such as one with a sheet resistance value exceeding 500 ohms/square. In other embodiments, the resistance device 124 may include a high resistance resistor with a sheet resistance value varying between about 700 ohms/square to about 900 ohms/square.

Referring now to FIGS. 5-8. FIGS. 5-8 include some of the same reference numbers used to describe the integrated circuit system 100 in FIGS. 1-4 and the process steps of FIGS. 1-4. It is noted that the layers, structures, and process steps corresponding to such reference numbers generally include the same characteristics (e.g., composition, thickness, function, process techniques, etc.) as those described in reference to FIGS. 1-4 and, therefore, their descriptions are not reiterated in detail for FIGS. 5-8. Rather the descriptions of the layers, structures, and process steps corresponding to reference numbers in FIGS. 1-4 are incorporated for the same reference numbers included in FIGS. 5-8.

Figure 5:
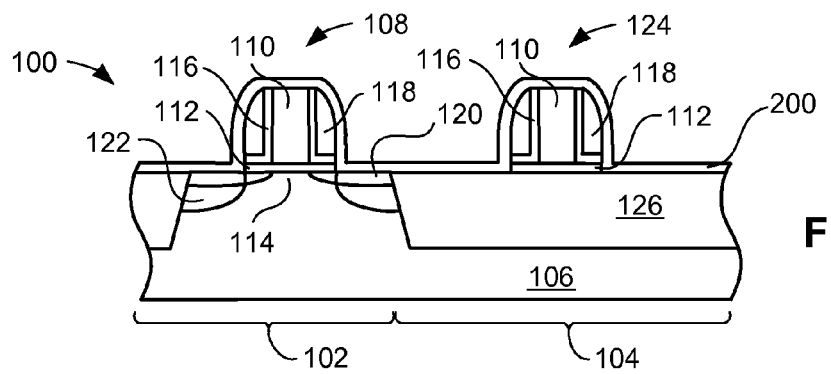
FIG. 5 is a partial cross sectional view of an integrated circuit system in an initial stage of manufacture in accordance with another embodiment of the present invention.

Referring now to FIG. 5, therein is shown a partial cross sectional view of the integrated circuit system 100 in an initial stage of manufacture in accordance with another embodiment of the present invention. The integrated circuit system 100 may include the first region 102, the second region 104, the substrate 106, the first device 108, the gate 110, the gate dielectric 112, the channel 114, the liner 116, the spacer 118, the source/drain extension 120, the source/drain 122, the resistance device 124, and the isolation structure 126. It is to be understood that the substrate 106, the first device 108, the gate 110, the gate dielectric 112, the channel 114, the liner 116, the spacer 118, the source/drain extension 120, the source/drain 122, the resistance device 124, and the isolation structure 126 may include any of the characteristics, such as material composition, thickness, and process techniques, described above in regard to FIG. 1.

The integrated circuit system 100, however, differs from the integrated circuit system 100, of FIG. 1, by including a hydrogen treatment process for the first dielectric layer 200 (i.e., processing the first dielectric layer 200 with a hydrogen treatment). In such cases, the hydrogen treatment helps to increase the concentration of hydrogen within the first dielectric layer 200, thereby enhancing the ability of the first dielectric layer 200 to promote out-diffusion and/or deactivation of dopants from within the resistance device 124. It is to be understood that the first dielectric layer 200 may include any of the characteristics, such as material composition, thickness, and process techniques, described above in regard to FIG. 2.

In some embodiments, the hydrogen treatment may include a hydrogen forming gas anneal. In such cases, the hydrogen forming gas anneal may include a hydrogen percentage ranging from 0% to 100% pure hydrogen. In other cases, the hydrogen forming gas anneal may more specifically include a 5% hydrogen and 95% nitrogen gas or a 10% hydrogen and 90% nitrogen gas. As an exemplary illustration, the hydrogen forming gas anneal process may include a temperature of about 350° C. to about 475° C., and a time of about 10 minutes to about several hours (e.g., 5 hours). However, it is to be understood that these parameters (e.g., hydrogen percentage, temperature, and time) are not limiting and those skilled in the art will appreciate that additional parameters may also be employed/manipulated to effectuate the purpose of forming the first dielectric layer 200 with an increased hydrogen concentration.

In other embodiments, the hydrogen treatment may include a hydrogen plasma treatment. It is to be understood that the hydrogen plasma treatment process parameters can be manipulated to alter the hydrogen content within the first dielectric layer 200 to cause out-diffusion and deactivation of a dopant from within a structure located adjacent the first dielectric layer 200. For example, higher plasma powers and longer durations for the hydrogen plasma treatment can increase the content of hydrogen within the first dielectric layer 200. As an exemplary illustration, the hydrogen plasma treatment may include a pressure of about 0.3 to about 20 (Torr), an RF power of about 20 to about 3000 (Watts), an $H_2$ flow rate of about 100 to about 10,000 (sccm), the substrate 106 temperature of about 15° C. to about 550° C., and a time of about 5 seconds to about 5 minutes. However, it is to be understood that these parameters are not limiting and those skilled in the art will appreciate that additional parameters may also be employed/manipulated to effectuate the purpose of forming the first dielectric layer 200 with an increased hydrogen concentration.

Figure 6:
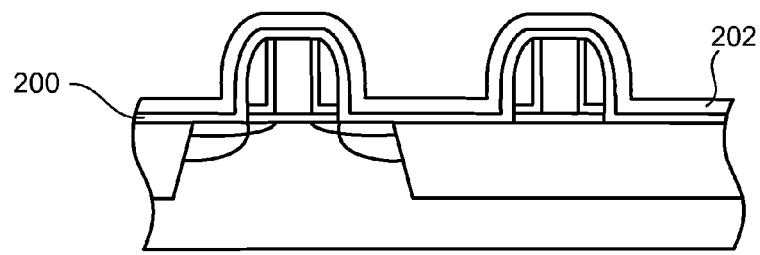
FIG. 6 is the structure of FIG. 5 after forming a second dielectric layer.

Referring now to FIG. 6, therein is shown the structure of FIG. 5 after forming the second dielectric layer 202. The second dielectric layer 202 can be formed over or on the first dielectric layer 200. It is to be understood that the second dielectric layer 202 may include any of the characteristics, such as material composition, thickness, and process techniques, described above in regard to FIG. 2. In some embodiments, the second dielectric layer 202 includes a material with a density specifically engineered to prevent the outgassing of hydrogen from the first dielectric layer 200. In other embodiments, the second dielectric layer 202 may preferably include a silicon nitride layer deposited by a RTCVD process, thereby increasing the density of the second dielectric layer 202.

Figure 7:
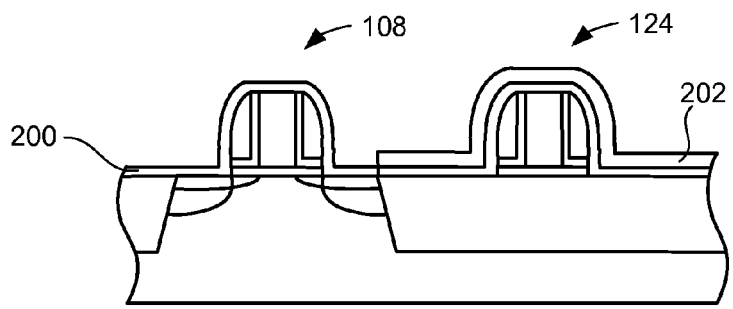
FIG. 7 is the structure of FIG. 6 after removing a second dielectric layer from over a first device.

Referring now to FIG. 7, therein is shown the structure of FIG. 6 after removing the second dielectric layer 202 from over the first device 108. In some embodiments, the second dielectric layer 202 can be removed from over the first device 108 in a manner similar to the processes described in reference to FIG. 3 above. Additionally, subsequent to removing the second dielectric layer 202 from over the first device 108, an anneal step can be performed in a manner similar to the processes described in reference to FIG. 3 above.

Notably, the present inventors have discovered that by treating the first dielectric layer 200 with a hydrogen treatment and by not removing the second dielectric layer 202 from over the resistance device 124 that the resistance value of the resistance device 124 can be increased over that of a resistor formed without the second dielectric layer 202 and the first dielectric layer 200 with a hydrogen treatment. It is to be understood that the increased hydrogen concentration within the first dielectric layer 200 helps to promote out-diffusion and deactivation of the dopant within the resistance device 124, thereby increasing the resistance of the resistance device 124.

Accordingly, the present inventors have discovered a method for easily modulating the resistance of the resistance device 124 by altering the density of the second dielectric layer 202 and/or by altering the hydrogen concentration within the first dielectric layer 200.

Figure 8:
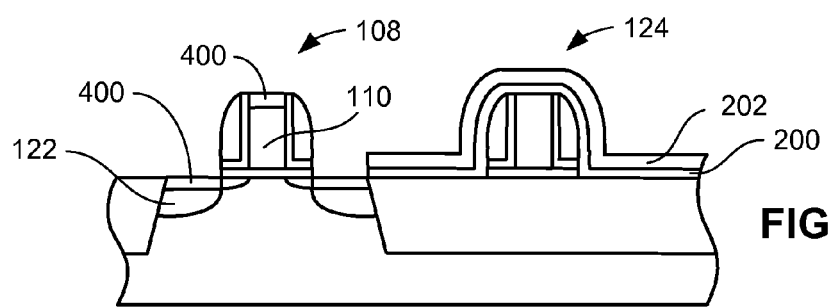
FIG. 8 is the structure of FIG. 7 after removing a first dielectric layer from over a first device.

Referring now to FIG. 8, therein is shown the structure of FIG. 7 after removing the first dielectric layer 200 from over the first device 108. In some embodiments, the first dielectric layer 200 can be removed from over the first device 108 in a manner similar to the processes described in reference to FIG. 4 above. Subsequent to removing the first dielectric layer 200 from over the first device 108, the electrical contact 400, such as a low resistance silicide or salicide electrical contact, can be formed over the gate 110 and the source/drain 122 of the first device 108 by processes well known within the art for forming the electrical contact 400. It is to be understood that the first dielectric layer 200 and the second dielectric layer 202 remaining over the resistance device 124 prevents and/or blocks the deposition of a low resistance silicide electrical contact, thereby preventing a lowering of the resistance of the resistance device 124.

It is to be understood that the above process steps form a high resistance resistor by blocking the formation of a silicide contact from forming on the resistance device 124, by removing dopants from the resistance device 124, and/or by utilizing a hydrogen treated form of the first dielectric layer 200. In some embodiments, the resistance device 124 formed by the above process steps may include a high resistance resistor, such as one with a sheet resistance value exceeding 500 ohms/square. In other embodiments, the resistance device 124 may include a high resistance resistor with a sheet resistance value varying between about 700 ohms/square to about 900 ohms/square.

Embodiment Two

FIGS. 9-20, which follow, depict by way of example and not by limitation, an exemplary process flow for the formation of an integrated circuit system and they are not to be construed as limiting. It is to be understood that a plurality of conventional processes that are well known within the art and not repeated herein, may precede or follow FIGS. 9-20. Moreover, it is to be understood that many modifications, additions, and/or omissions may be made to the below described process without departing from the scope or spirit of the claimed subject matter. For example, the below described process may include more, fewer, or other steps. Additionally, steps may be performed in any suitable order without departing from the scope of the present invention.

Moreover, it is to be appreciated that the integrated circuit system of the present disclosure may include any number of multi-electrode devices in which the current flowing between two specified electrodes is controlled or modulated by the voltage applied at a control electrode. Exemplary illustrations may include an n-channel field effect transistor (NFET), a p-channel field effect transistor (PFET), a complementary metal-oxide-silicon (CMOS) configuration, a single-gate transistor, a multi-gate transistor, a fin-FET, or an annular gate transistor. Additionally, it is to be understood that the integrated circuit system of the present disclosure may include any number of resistance devices with varying resistance values formed by strategically altering the process techniques described herein. Furthermore, it is to be understood that one or more of the integrated circuit system could be prepared at one time on a medium, which could be separated into individual or multiple integrated circuit assemblies at a later stage of fabrication.

Referring now to FIGS. 9-12. FIGS. 9-12 include some of the same reference numbers used to describe the integrated circuit system 100 in FIGS. 1-4 and the process steps of FIGS. 1-4. It is noted that the layers, structures, and process steps corresponding to such reference numbers generally include the same characteristics (e.g., composition, thickness, function, process techniques, etc.) as those described in reference to FIGS. 1-4 and, therefore, their descriptions are not reiterated in detail for FIGS. 9-12. Rather the descriptions of the layers, structures, and process steps corresponding to reference numbers in FIGS. 1-4 are incorporated for the same reference numbers included in FIGS. 9-12.

Figure 9:
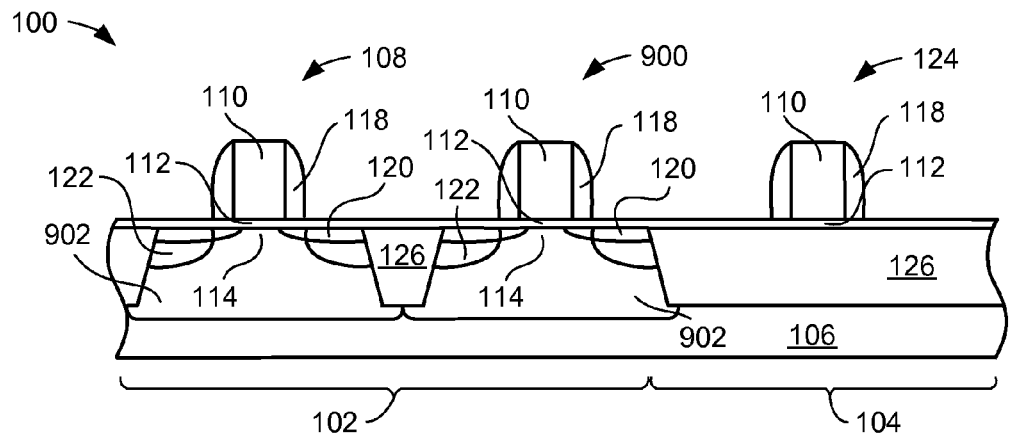
FIG. 9 is a partial cross sectional view of an integrated circuit system in an initial stage of manufacture in accordance with another embodiment of the present invention.

Referring now to FIG. 9, therein is shown a partial cross sectional view of the integrated circuit system 100 in an initial stage of manufacture in accordance with another embodiment of the present invention. The integrated circuit system 100 includes the first region 102 and the second region 104. In some embodiments, the first region 102 may include active and passive devices and the second region 104 may include passive devices. In other embodiments, the first region 102 may include, more particularly, any number of multi-electrode devices in which the current flowing between two specified electrodes is controlled or modulated by the voltage applied at a control electrode and the second region 104 may include, more particularly, any number of resistance devices with varying resistance values formed by strategically altering the process techniques described herein. It is to be understood that the integrated circuit system 100 can be used within processor components, memory components, logic components, digital components, analog components, mixed-signal components, power components, radio-frequency (RF) components (e.g., RF CMOS circuits), digital signal processor components, micro-electromechanical components, optical sensor components, and so forth, in numerous configurations and arrangements as may be needed.

The first region 102 and the second region 104 are formed within or over the substrate 106. By way of example, the substrate 106 may include any semiconducting material, such as, Si, SiC, SiGe, Si/SiGe, SiGeC, Ge, GaAs, InAs, InP, other III/V or II/VI compound semiconductors, as well as silicon-on-insulator configurations. Additionally, the substrate 106 may also include doped and undoped configurations, epitaxial layers, strained configurations, and one or more crystal orientations (e.g.—<100>, <110>, and/or <111> orientations), which may be strategically employed to optimize carrier mobility within NFET and PFET devices. The substrate 106 may also include any material that becomes amorphous upon implantation.

In some embodiments, the substrate 106 may possess a thickness ranging from about one hundred (100) nanometers to about several hundred microns, for example.

However, the examples provided for the substrate 106 are not to be construed as limiting and the composition of the substrate 106 may include any material, configuration, or thickness that physically and electrically enables the formation of active and/or passive device structures.

The first device 108 and a second device 900 can be formed over, on and/or within the substrate 106 by conventional deposition, patterning, photolithography, and etching techniques known in the semiconductor processing industry for the manufacture of active and/or passive devices. In some embodiments, the first device 108 and the second device 900 may include one or more of a PFET device and/or an NFET device. In other embodiments, the first device 108 and the second device 900 may include a PFET device and an NFET device cooperatively coupled, thereby forming a CMOS device.

In general, the first device 108 and the second device 900 both include the gate 110, the gate dielectric 112, the channel 114, the spacer 118, the source/drain extension 120, the source/drain 122, and a well 902.

It is to be understood that the well 902 can be formed within the substrate 106 prior to or subsequent to the formation of the gate 110 and the gate dielectric 112, depending upon, for example, the desired dopant concentration within the channel 114. Generally, the dopants used to form the well 902 are of opposite conductivity type as compared to the dopants used to form the source/drain extension 120 and the source/drain 122 (i.e., p-type impurities for NFET devices and n-type impurities for PFET devices). It is to be understood that the depth, dopant concentration, and energy used to form the well 902 can depend upon the dopant used and the design specifications of the first device 108 and the second device 900.

In some embodiments, the gate 110 may be formed from conventional materials including doped and undoped semiconducting materials (such as, for example, polySi, amorphous Si, or SiGe), a metal, a metallic alloy, a silicide, or a combination thereof, for example. In other embodiments, the gate 110 may also include any conducting material or composition that becomes amorphous upon implantation. The gate dielectric 112 may be made from materials including, but not limited to, silicon oxide, silicon oxynitride, silicon nitride, a silicon oxide/nitride/oxide stack, a high-k dielectric material (i.e.—one having a dielectric constant value greater than silicon oxide), or a combination thereof. However, it is to be understood that the type of material chosen for the gate dielectric 112 is not limited to the above examples; for example, the gate dielectric 112 may include any material that permits induction of a charge in the channel 114 when an appropriate voltage is applied to the gate 110. Accordingly, other materials, which may be known to those skilled in the art for gate structures, may also be used for the gate 110 and the gate dielectric 112.

Generally, the thickness of the gate 110 is between about 500 angstroms and about 3000 angstroms and the thickness of the gate dielectric 112 is between about 10 angstroms and about 50 angstroms. However, larger or smaller thicknesses of the gate 110 and the gate dielectric 112 may be appropriate depending on the design specifications of the first device 108 and the second device 900.

The spacer 118 may be formed from conventional dielectric materials such as an oxide, a nitride, or a combination thereof, but preferably includes silicon nitride. However, it is to be understood that the type of materials chosen for the spacer 118 are not limited to the above examples and may include any material that permits electrical isolation of the gate 110 and formation of the source/drain 122 aligned to the spacer 118. Moreover, it is to be understood that the thickness of the spacer 118 will vary with the design specifications of the first device 108 and the second device 900.

The first device 108 and the second device 900 may also include the source/drain extension 120 and the source/drain 122 formed adjacent the gate 110. In general, the source/drain extension 120 may be formed to a shallow depth with a low concentration of impurities relative to the source/drain 122. More specifically, the source/drain extension 120 may include a dopant concentration between about $1\times10^{16}$ ions/cm$^3$ to about $1\times10^{22}$ ions/cm$^3$. However, larger or smaller concentrations may be used depending upon the impurity used and the design specifications of the first device 108 and the second device 900.

The impurities used to form the source/drain extension 120 may include n-type or p-type, depending on the first device 108 and/or the second device 900 being formed (e.g., n-type impurities for an NMOS device and p-type impurities for a PMOS device). It is to be understood that the source/drain extension 120 can be formed by aligning the source/drain extension 120 to the gate 110 (i.e., before forming the spacer 118) or subsequent to forming the spacer 118 by employing an angled implant.

In some embodiments the source/drain 122 can be aligned to the spacer 118. In general, the source/drain 122 may be of the same conductivity type as the dopants used to form the source/drain extension 120 (e.g., n-type impurities for an NMOS device and p-type impurities for a PMOS device). Exemplary energies and concentrations used to form the source/drain 122 may include an energy between about 1 keV and about 150 keV and a concentration between about $1\times10^{16}$ ions/cm$^3$ to about $1\times10^{22}$ ions/cm$^3$. However, larger or smaller energies and concentrations may be used depending upon the impurity used and the design specifications of the first device 108 and the second device 900.

In yet other embodiments, the implant energy used to form the source/drain 122 must possess sufficient energy to amorphize at least a portion of the substrate 106 and/or at least a portion of the gate 110 of the first device 108 and the second device 900. An implant with sufficient energy to amorphize at least a portion of the substrate 106 and/or at least a portion of the gate 110 allows a subsequent anneal step to transfer/memorize a stress to the gate 110 and the source/drain 122 during recrystallization.

In some embodiments, the resistance device 124 can be formed over, on and/or within the substrate 106 by conventional deposition, patterning, photolithography, and etching techniques known in the semiconductor processing industry for the manufacture of active/passive devices. More specifically, the resistance device 124 can be formed over the isolation structure 126, such as a shallow trench isolation structure, which can electrically isolate and/or separate the resistance device 124 from the first device 108 and the second device 900. For purposes of illustration, the isolation structure 126 may be made from a dielectric material such as silicon dioxide ("SiO$_2$"). In some embodiments, the resistance device 124 may include a high resistance resistor, such as one with a resistance value exceeding 500 ohms/square.

The structure of the resistance device 124 is substantially similar to the first device 108 and the second device 900 and may include the gate 110, the gate dielectric 112, and the spacer 118, thereby enabling concurrent formation of the resistance device 124 with the first device 108 and the second device 900 on the substrate 106. It is noted that the layers, structures and process steps corresponding to similar reference numbers generally include the same characteristics (e.g.—composition, thickness, function, process techniques, etc.) as those described in reference to the first device 108 and the second device 900, and therefore, their descriptions are not reiterated in detail.

In some embodiments, the gate 110 of the resistance device 124 may be exposed to a dopant implant process used to form the source/drain 122 and/or the source/drain extension 120, thereby adversely altering the resistance of the resistance device 124 (e.g., lowering the desired resistance value of the resistance device 124 below the design specifications of the integrated circuit system 100). For example, the resistance device 124 may include a heavily p-type doped (i.e., p+) resistor, wherein the p-type dopant concentration within the gate 110 includes a concentration between about $1\times10^{16}$ ions/cm$^3$ to about $1\times10^{22}$ ions/cm3. However, larger or smaller concentrations may be used depending upon the impurity used and the design specifications of the resistance device 124.

It is to be understood that the resistance device 124 operates according to what is conventionally known in the art.

Figure 10:
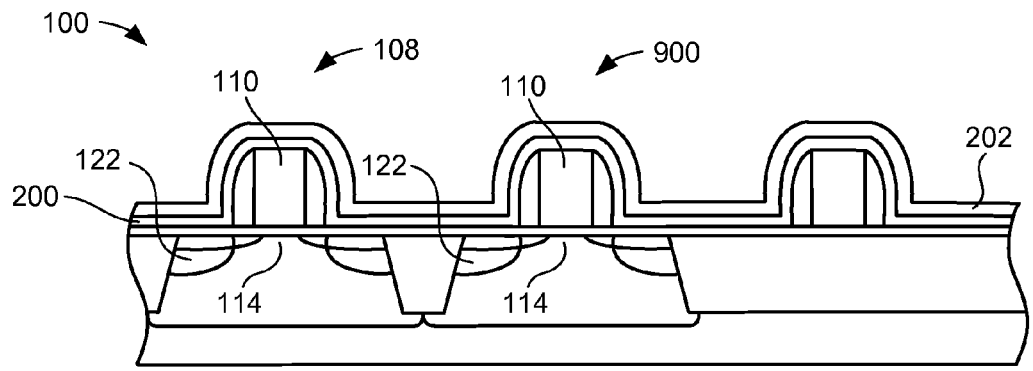
FIG. 10 is the structure of FIG. 9 after forming a first dielectric layer and a second dielectric layer.

Referring now to FIG. 10, therein is shown the structure of FIG. 9 after forming the first dielectric layer 200 and the second dielectric layer 202. The first dielectric layer 200 can be formed over or on the integrated circuit system 100. In some embodiments, the first dielectric layer 200 may include an insulating material such as an oxide grown by wet or dry oxidation techniques. In other embodiments, the first dielectric layer 200 may include an oxide deposited by chemical vapor deposition techniques. In yet other embodiments, the first dielectric layer 200 may include a low temperature oxide film deposited by reacting silane with either oxygen, nitrous oxide, or carbon dioxide at temperatures below about 800° C. in a plasma. In still yet other embodiments, the first dielectric layer 200 may include any oxide that is deposited using temperatures, pressures, and reactants to maximize the hydrogen concentration trapped within the first dielectric layer 200. In still other embodiments, the first dielectric layer 200 may include an oxide that has been treated with a hydrogen process to increase the concentration of hydrogen, similar to the processes described above in FIG. 5. By way of example, the first dielectric layer 200 may have a thickness ranging from about 50 angstroms to about 300 angstroms.

Subsequent to forming the first dielectric layer 200, the second dielectric layer 202 can be formed over or on the first dielectric layer 200. In some embodiments, the second dielectric layer 202 may include an insulating material such as a nitride deposited by low pressure chemical vapor deposition (LPCVD) or plasma enhanced chemical vapor deposition (PECVD). In other embodiments, the first dielectric layer 200 may include a silicon nitride film deposited by rapid thermal chemical vapor deposition (RTCVD). In yet other embodiments, the second dielectric layer 202 may include any nitride that is deposited using temperatures, pressures, and reactants to maximize or increase the hydrogen concentration trapped within the second dielectric layer 202. In still yet other embodiments, the second dielectric layer 202 may include a nitride that is deposited using temperatures, pressures, and reactants to maximize or increase the density of the second dielectric layer 202. In general, the second dielectric layer 202 may have a thickness ranging from about 200 angstroms to about 700 angstroms.

In other embodiments, the second dielectric layer 202 may include any material, such as a stress memorization material/layer, that transfers its inherent or intrinsic stress to the gate 110, the channel 114, and/or the source/drain 122 of the first device 108 and/or the second device 900 during an anneal step. In general, when the second dielectric layer 202 includes the characteristics of a stress memorization layer, the second dielectric layer 202 can transfer its intrinsic stress to the first device 108 and/or the second device 900 upon recrystallization of the amorphous regions within the first device 108 and/or the second device 900. By way of example, the second dielectric layer 202 may include a compressively stressed layer or a tensile stressed layer.

It is to be understood that the stress induced within the first device 108 and/or the second device 900 by the second dielectric layer 202 can be increased by increasing the intrinsic stress within the second dielectric layer 202. For example, a multitude of deposition parameters, such as reactant flow rates, pressure, temperature, RF power, reactant materials, and thickness, can be adjusted to modulate the intrinsic stress within the second dielectric layer 202 and thereby maximize its stress transference effect upon the first device 108 and/or the second device 900. In an embodiment, the second dielectric layer 202 may include a silicon nitride layer deposited by a plasma enhanced chemical vapor deposition process.

Moreover, it is to be understood that the second dielectric layer 202 can be strategically designed to exhibit the characteristics of increased density, increases hydrogen concentration, and stress memorization transference.

Figure 11:
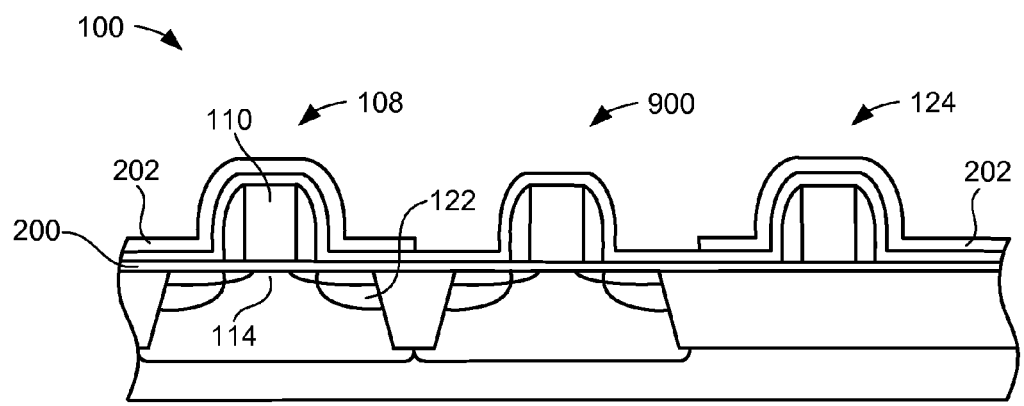
FIG. 11 is the structure of FIG. 10 after removing a second dielectric layer from over a second device.

Referring now to FIG. 11, therein is shown the structure of FIG. 10 after removing the second dielectric layer 202 from over the second device 900. However, it is to be understood that exposure of the second device 900 versus exposure of the first device 108 is not critical, what is important is that the second dielectric layer 202 be removed from over any structure that can act as a PFET device. Accordingly, for purposes of discussion, the second device 900 can be referred to as a PFET device for the remainder of this embodiment.

In some embodiments, the second dielectric layer 202 can be removed from over the second device 900 by forming and processing a mask layer (not shown). In such cases, the first dielectric layer 200 remains over the first device 108, the second device 900 and the resistance device 124, while the second dielectric layer 202 remains intact over the first device 108 and the resistance device 124.

Subsequent to patterning the mask layer, the exposed portion of the second dielectric layer 202 formed over the second device 900 can be etched to form an opening within the second dielectric layer 202 by methods selective to the composition of the second dielectric layer 202. Generally, the second dielectric layer 202 can be etched by common gas chemistries such as $CF_4$, $SiF_4$, $NF_3$, $CHF_3$ and $C_2F_6$. In other cases, the second dielectric layer 202 can be removed by any dry etching process that removes a nitride material. However, it is to be understood that the type of gas chemistry used to etch the second dielectric layer 202 is not essential, what is important is that the second dielectric layer 202 is removed from over the second device 900 after etching. It is to be understood that removal of the second dielectric layer 202 from over the second device 900 helps to prevent any adverse effects that the second dielectric layer 202 may have upon a PFET device during annealing.

Subsequent to removing the mask layer and the second dielectric layer 202 from over the second device 900, an anneal step is performed to electrically activate the dopants within the first device 108 and the second device 900. It is to be understood that the anneal step may include any thermal process that electrically activates the dopants within the first device 108 and the second device 900, such as a rapid thermal anneal, a spike anneal and/or a laser anneal.

Notably, the present inventors have discovered that by not removing the second dielectric layer 202 from over the resistance device 124 that the sheet resistance value of the resistance device 124 can be increased by about 35% over that of a resistor formed without the second dielectric layer 202. This increase in the sheet resistance of the resistance device 124 is approximately equivalent to employing a reduced source and drain dose of about $1.5 \times 10^{15}$ ions/cm$^2$ (noting that a conventional source and drain dose is about $2 \times 10^{15}$ ions/cm$^2$). Moreover, the present inventors have found this process to very repeatable and easily implemented because no additional process steps are required.

The present inventors have discovered that the resistance value of the resistance device 124 can be increased by about 35% by merely forming and/or altering the density of the second dielectric layer 202 formed over the resistance device 124. It is to be understood that the density of the second dielectric layer 202 can be altered/increased by strategically manipulating the deposition parameters and the deposition methods used to form the second dielectric layer 202. Moreover, it is to be understood that the resistance value of the resistance device 124 can also be increased by employing a hydrogen treatment process for the first dielectric layer 200.

More particularly, the present inventors have discovered that by modulating the hydrogen concentration within the first dielectric layer 200 and/or by modulating the density of the second dielectric layer 202 that the resistance value of the resistance device 124 can be increased even further. It is to be understood that an increased hydrogen concentration within the first dielectric layer 200 can help promote out-diffusion and deactivation of the dopant within the resistance device 124, thereby increasing the resistance of the resistance device 124. Moreover, it is to be understood that increasing the density of the second dielectric layer 202 can help block the out-gassing of hydrogen from the first dielectric layer 200, thereby helping to increase the resistance of the resistance device 124.

Accordingly, the present inventors have discovered a method for easily modulating the resistance of the resistance device 124 by merely forming and/or altering the density of the second dielectric layer 202 that does not require additional process steps. Not wishing to be limited to any particular theory, the present inventors believe that the increase in resistance of the resistance device 124 is due in part to the ability of the second dielectric layer 202 to prevent hydrogen flushing or out-gassing from the first dielectric layer 200. It is to be understood that as the density of the second dielectric layer 202 increases, its ability to block the diffusion or out-gassing of hydrogen is also increased. It is believed that the hydrogen trapped by the second dielectric layer 202 causes out-diffusion and deactivation of the dopant within the resistance device 124. More specifically, the hydrogen trapped within the first dielectric layer 200 adjacent the resistance device 124 can cause boron, for example, within the resistance device 124 to out-gas and become deactivated upon binding to the hydrogen, thereby increasing the resistance of the resistance device 124.

Additionally, the present inventors have discovered that by not removing the second dielectric layer 202 from over the first device 108 that the performance of the first device 108 can be enhanced. It is to be understood that the anneal step employed to electrically activate dopants within the first device 108 can also transfer the intrinsic stress from within the second dielectric layer 202 into the gate 110 and/or the source/drain 122 of the first device 108. After annealing with the second dielectric layer 202 formed over the first device 108, each of the gate 110, the channel 114 and/or the source/drain 122 of the first device 108 can be described as exhibiting the characteristics of stress memorization (i.e., their physical properties have been affected by the second dielectric layer 202). For example, the gate 110, the channel 114 and/or the source/drain 122 may exhibit a tensile stressed nature or a compressive stressed nature.

The present invention achieves stress memorization transfer by annealing the integrated circuit system 100 with a temperature sufficiently high enough to cause recrystallization of amorphous regions (e.g., due to previous implantations) located within the gate 110 and/or the source/drain 122 of the first device 108. The stress from the second dielectric layer 202 can be retained within the gate 110 and/or the source/drain 122 through the recrystallization anneal.

Not wishing to be limited to any particular theory, the present inventors believe that during annealing, the amorphous regions located within the gate 110 and/or the source/drain 122 of the first device 108 are recrystallized under a field of stress induced by the second dielectric layer 202. The field of stress induced by the second dielectric layer 202 is believed to cause the atoms of the gate 110 and/or the source/drain 122 to align or crystallize with a compressively stressed lattice constant or a tensile stressed lattice constant.

The stress transferred by the second dielectric layer 202 into the gate 110 and/or the source/drain 122 of the first device 108 improves the carrier mobility of the integrated circuit system 100. The carrier mobility of the integrated circuit system 100 is improved because the recrystallized stressed regions of the gate 110 and/or the source/drain 122 induce stress within the channel 114, thereby improving carrier mobility.

It is to be understood that the anneal of the present invention may include any thermal process that causes the amorphous regions of the gate 110 and/or the source/drain 122 of the first device 108 to recrystallize under the stress of, and retain the stress of, the second dielectric layer 202. As exemplary illustrations, the anneal may include a rapid thermal anneal, a spike anneal and/or a laser anneal.

Figure 12:
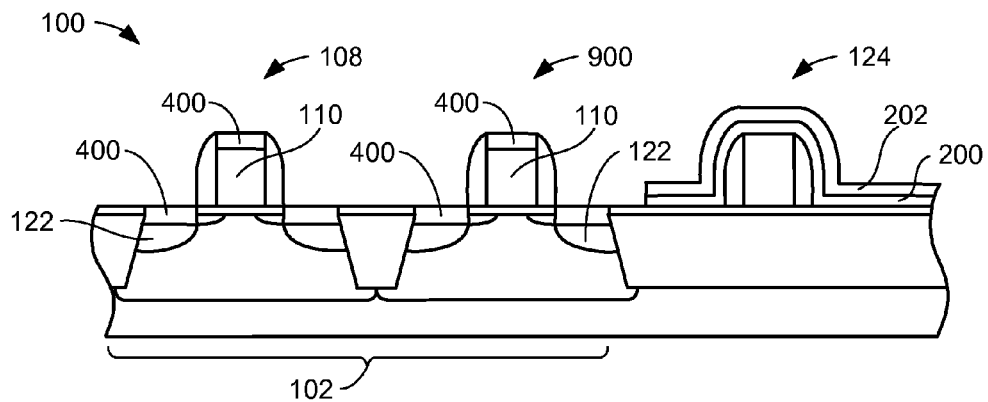
FIG. 12 is the structure of FIG. 11 after removing a first dielectric layer and a second dielectric layer from over a first region.

Referring now to FIG. 12, therein is shown the structure of FIG. 11 after removing the first dielectric layer 200 and the second dielectric layer 202 from over the first region 102. In some embodiments, the second dielectric layer 202 can be removed from over the first device 108 by forming an additional mask (not shown) over the resistance device 124 and etching the remaining exposed portion of the second dielectric layer 202. In such cases, the second dielectric layer 202 can be etched by common wet or dry etch chemistries. However, it is to be understood that the type of etch chemistry used to etch the second dielectric layer 202 is not essential, what is important is that the second dielectric layer 202 is removed from over the first device 108 after etching.

Subsequent to removing the second dielectric layer 202 from over the first device 108, an additional etch process can be employed to remove the first dielectric layer 200 from over the first device 108 and the second device 900. By way of example, the etch process may include a salicide preclean etch. However, it is to be understood that the etch process/chemistry used to remove the first dielectric layer 200 from over the first device 108 and the second device 900 is not critical, what is important is that the etch process/chemistry prepare the integrated circuit system 100 for formation of the electrical contact 400 over the gate 110 and the source/drain 122 of the first device 108 and the second device 900.

Subsequent to removing the first dielectric layer 200 from over the first device 108 and the second device 900, the electrical contact 400, such as a low resistance silicide electrical contact, can be formed over the gate 110 and the source/drain 122 of the first device 108 and the second device 900 by processes well known within the art for forming the electrical contact 400. It is to be understood that the first dielectric layer 200 and the second dielectric layer 202 remaining over the resistance device 124 prevents and/or blocks the deposition of a low resistance silicide electrical contact (i.e., the electrical contact 400), thereby preventing a lowering of the resistance of the resistance device 124.

It is to be understood that the above process steps form a high resistance resistor by blocking the formation of the electrical contact 400 from forming on the resistance device 124 and by removing dopants from the resistance device 124. In some embodiments, the resistance device 124 formed by the above process steps may include a high resistance resistor, such as one with a sheet resistance value exceeding 500 ohms/square. In other embodiments, the resistance device 124 may include a high resistance resistor with a sheet resistance value varying between about 750 ohms/square to about 775 ohms/square.

Moreover, it is to be understood that the above process steps also forms active device structures with improved carrier mobility within the first region 102 by selectively utilizing stress memorization transfer techniques.

Referring now to FIGS. 13-16. FIGS. 13-16 include some of the same reference numbers used to describe the integrated circuit system 100 in FIGS. 9-12 and the process steps of FIGS. 9-12. It is noted that the layers, structures, and process steps corresponding to such reference numbers generally include the same characteristics (e.g., composition, thickness, function, process techniques, etc.) as those described in reference to FIGS. 9-12 and, therefore, their descriptions are not reiterated in detail for FIGS. 13-16. Rather the descriptions of the layers, structures, and process steps corresponding to reference numbers in FIGS. 9-12 are incorporated for the same reference numbers included in FIGS. 13-16.

Figure 13:
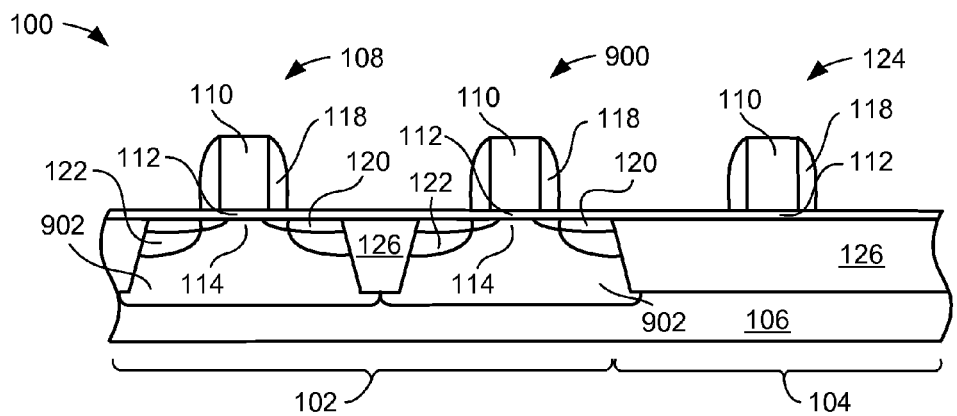
FIG. 13 is a partial cross sectional view of an integrated circuit system in an initial stage of manufacture in accordance with another embodiment of the present invention.

Referring now to FIG. 13, therein is shown a partial cross sectional view of the integrated circuit system 100 in an initial stage of manufacture in accordance with another embodiment of the present invention. The integrated circuit system 100 may include the first region 102, the second region 104, the substrate 106, the first device 108, the gate 110, the gate dielectric 112, the channel 114, the spacer 118, the source/drain extension 120, the source/drain 122, the resistance device 124, the isolation structure 126, the second device 900 and the well 902. It is to be understood that the substrate 106, the first device 108, the gate 110, the gate dielectric 112, the channel 114, the spacer 118, the source/drain extension 120, the source/drain 122, the resistance device 124, the isolation structure 126, the second device 900, and the well 902 may include any of the characteristics, such as material composition, thickness, and process techniques, described above in regard to FIG. 9.

Figure 14:
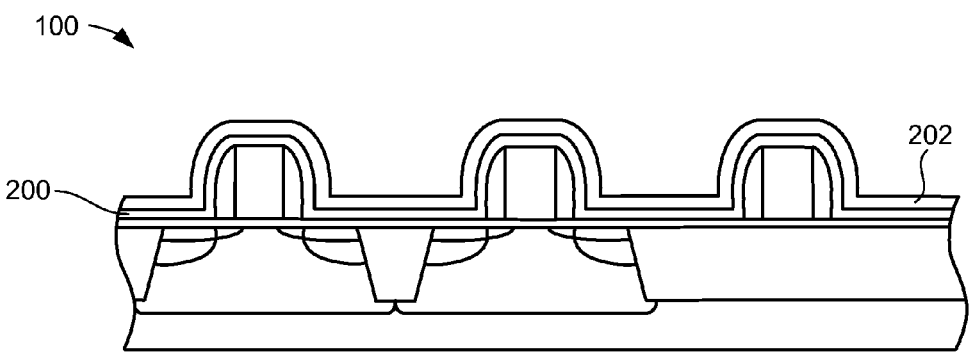
FIG. 14 is the structure of FIG. 13 after forming a first dielectric layer and a second dielectric layer.

Referring now to FIG. 14, therein is shown the structure of FIG. 13 after forming the first dielectric layer 200 and the second dielectric layer 202. The first dielectric layer 200 can be formed over or on the integrated circuit system 100 and the second dielectric layer 202 can be formed over or on the first dielectric layer 200. It is to be understood that the first dielectric layer 200 and the second dielectric layer 202 may include any of the characteristics, such as material composition, thickness, and process techniques, described above in regard to FIG. 10.

By way of example, in some embodiments, the first dielectric layer 200 may include a material with increased hydrogen concentration. In other embodiments, the first dielectric layer may include an oxide that has undergone a hydrogen treatment in a manner similar to the processes described in FIG. 5 above.

Additionally, in some embodiments, the second dielectric layer 202 may include a material with a density specifically engineered to prevent the out-gassing of hydrogen from the first dielectric layer 200. In other embodiments, the second dielectric layer 202 may preferably include a silicon nitride layer deposited by a RTCVD process, thereby increasing the density of the second dielectric layer 202.

Figure 15:
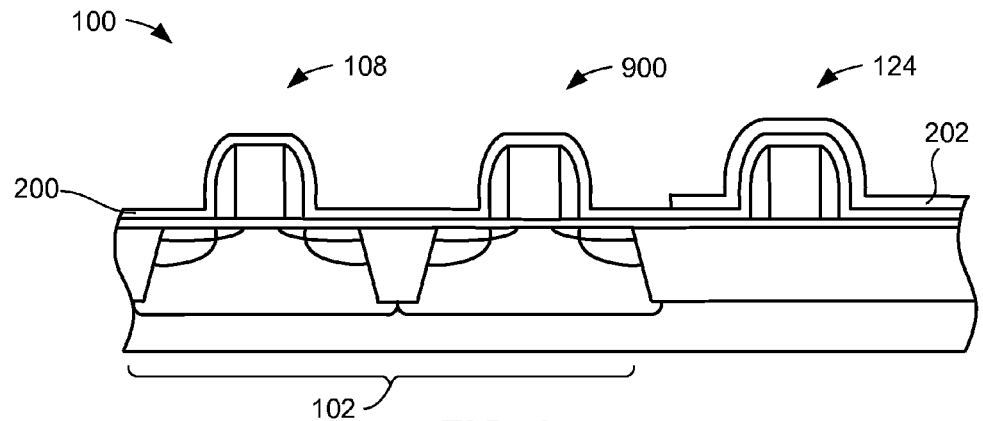
FIG. 15 is the structure of FIG. 14 after removing a second dielectric layer from over a first device and a second device.

Referring now to FIG. 15, therein is shown the structure of FIG. 14 after removing the second dielectric layer 202 from over the first device 108 and the second device 900. In some embodiments, the second dielectric layer 202 can be removed from over the first device 108 and the second device 900 by forming and processing a mask layer (not shown) to expose the first device 108 and the second device 900. In such cases, the first dielectric layer 200 remains over the first device 108, the second device 900 and the resistance device 124, while the second dielectric layer 202 remains intact over the resistance device 124.

Subsequent to patterning the mask layer, the exposed portion of the second dielectric layer 202 formed over the first device 108 and the second device 900 can be etched by methods selective to the composition of the second dielectric layer 202. Generally, the second dielectric layer 202 can be etched by common gas chemistries such as $CF_4$, $SiF_4$, $NF_3$, $CHF_3$ and $C_2F_6$. However, it is to be understood that the type of gas chemistry used to etch the second dielectric layer 202 is not essential, what is important is that the second dielectric layer 202 is removed from over the first device 108 and the second device 900 after etching. It is to be understood that selective removal of the second dielectric layer 202 from over the first region 102 can prevent the application of the stress memorization transfer process to selected structures within the first region 102.

Additionally, subsequent to removing the second dielectric layer 202 from over the first device 108 and the second device 900, an anneal step can be performed in a manner similar to the processes described in reference to FIG. 11 above.

Notably, the present inventors have discovered that by not removing the first dielectric layer 200 and the second dielectric layer 202 from over the resistance device 124 that the resistance value of the resistance device 124 can be increased over that of a resistor formed without the second dielectric layer 202. More particularly, the present inventors have discovered that by modulating the hydrogen concentration within the first dielectric layer 200 and/or by modulating the density of the second dielectric layer 202 that the resistance value of the resistance device 124 can be increased even further. It is to be understood that an increased hydrogen concentration within the first dielectric layer 200 can help promote out-diffusion and deactivation of the dopant within the resistance device 124, thereby increasing the resistance of the resistance device 124. Moreover, it is to be understood that increasing the density of the second dielectric layer 202 can help block the out-gassing of hydrogen from the first dielectric layer 200, thereby helping to increase the resistance of the resistance device 124.

Accordingly, the present inventors have discovered a method for easily modulating the resistance of the resistance device 124 by altering the hydrogen concentration within the first dielectric layer 200 and by altering the density of the second dielectric layer 202.

Figure 16:
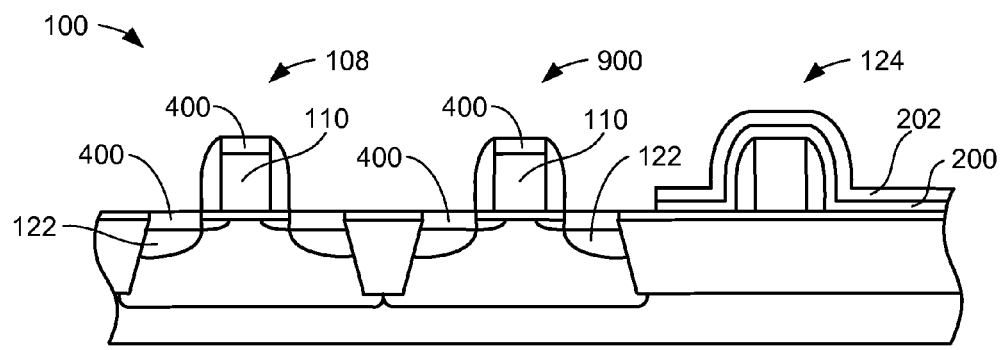
FIG. 16 is the structure of FIG. 15 after removing a first dielectric layer from over a first device and a second device.

Referring now to FIG. 16, therein is shown the structure of FIG. 15 after removing the first dielectric layer 200 from over the first device 108 and the second device 900. In some embodiments, the first dielectric layer 200 can be removed from over the first device 108 and the second device 900 in a manner similar to the processes described in reference to FIG. 12 above. Subsequent to removing the first dielectric layer 200 from over the first device 108 and the second device 900, the electrical contact 400, such as a low resistance silicide or salicide electrical contact, can be formed over the gate 110 and the source/drain 122 of the first device 108 and the second device 900 by processes well known within the art for forming the electrical contact 400. It is to be understood that the first dielectric layer 200 and the second dielectric layer 202 remaining over the resistance device 124 prevents and/or blocks the deposition of a low resistance silicide electrical contact, thereby preventing a lowering of the resistance of the resistance device 124.

It is to be understood that the above process steps form a high resistance resistor by blocking the formation of a silicide contact from forming on the resistance device 124 and by removing dopants from the resistance device 124. In some embodiments, the resistance device 124 formed by the above process steps may include a high resistance resistor, such as one with a sheet resistance value exceeding 500 ohms/square. In other embodiments, the resistance device 124 may include a high resistance resistor with a sheet resistance value varying between about 750 ohms/square to about 775 ohms/square.

Referring now to FIGS. 17-20. FIGS. 17-20 include some of the same reference numbers used to describe the integrated circuit system 100 in FIGS. 9-12 and the process steps of FIGS. 9-12. It is noted that the layers, structures, and process steps corresponding to such reference numbers generally include the same characteristics (e.g., composition, thickness, function, process techniques, etc.) as those described in reference to FIGS. 9-12 and, therefore, their descriptions are not reiterated in detail for FIGS. 17-20. Rather the descriptions of the layers, structures, and process steps corresponding to reference numbers in FIGS. 9-12 are incorporated for the same reference numbers included in FIGS. 17-20.

Figure 17:
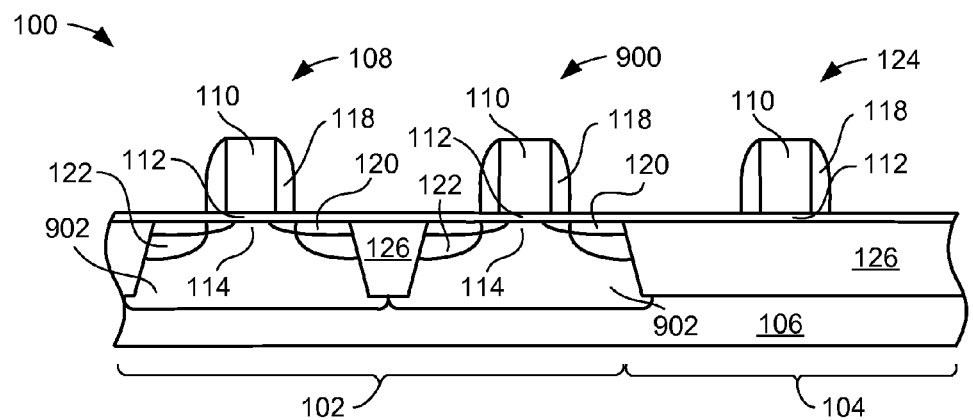
FIG. 17 is a partial cross sectional view of an integrated circuit system in an initial stage of manufacture in accordance with another embodiment of the present invention.

Referring now to FIG. 17, therein is shown a partial cross sectional view of the integrated circuit system 100 in an initial stage of manufacture in accordance with another embodiment of the present invention. The integrated circuit system 100 may include the first region 102, the second region 104, the substrate 106, the first device 108, the gate 110, the gate dielectric 112, the channel 114, the spacer 118, the source/drain extension 120, the source/drain 122, the resistance device 124, the isolation structure 126, the second device 900 and the well 902. It is to be understood that the substrate 106, the first device 108, the gate 110, the gate dielectric 112, the channel 114, the spacer 118, the source/drain extension 120, the source/drain 122, the resistance device 124, the isolation structure 126, the second device 900, and the well 902 may include any of the characteristics, such as material composition, thickness, and process techniques, described above in regard to FIG. 9.

However, in some embodiments, the substrate 106 differs from the substrate 106, of FIG. 9, by orienting the substrate 106 of the present embodiment at a forty-five degree angle with respect to the preferred crystalline plane orientation, thereby strategically enhancing the carrier mobility within the channel 114 of the first device 108 and/or the second device 900. For example, the substrate 106 can be oriented forty-five degrees with respect to a standard [001] surface with a notch along <110>, thereby strategically making standard [001] surface with rotated notch along <100> (i.e., the channel orientation direction of the first device 108 and the second device 900 becomes <100>). It is to be understood that rotating the substrate 106 can help to alter the carrier mobility and influence of stress memorization transfer techniques upon the first device 108 and the second device 900.

Figure 18:
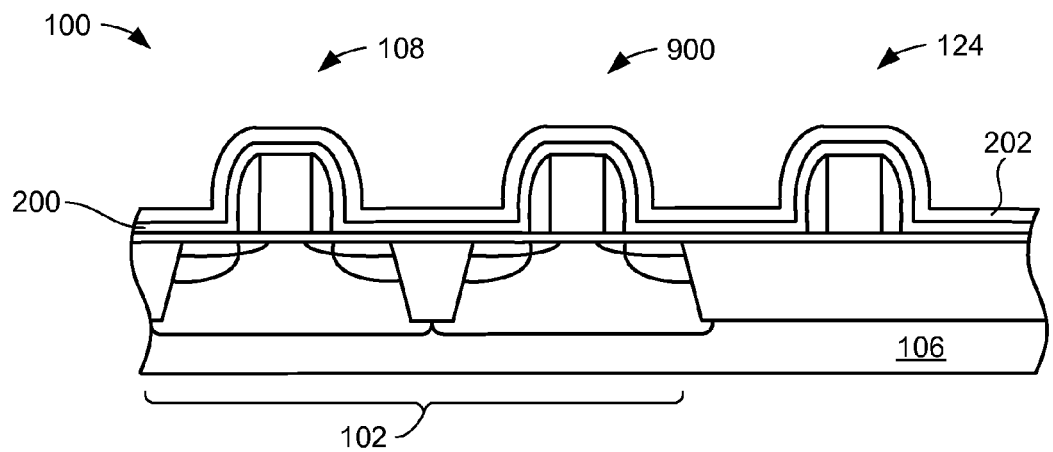
FIG. 18 is the structure of FIG. 17 after forming a first dielectric layer and a second dielectric layer.

For example, by rotating the substrate 106 forty-five degrees with respect to a standard [001] surface with a notch along <110>, the mechanical stress induced by the second dielectric layer 202, of FIG. 18, upon the first device 108 and the second device 900 can be partially reduced. By evaluating the orientation dependence of the substrate 106 upon piezoresistance coefficients, the first device 108 and/or the second device 900 can be tuned (i.e., formed within a crystalline plane that is rotated between zero and forty-five degrees from the preferred crystalline orientation) to be unaffected by the applied stress of the second dielectric layer 202. Alternatively, the orientation of the first device 108 and the second device 900 may also be tuned to enhance the applied stress of the second dielectric layer 202.

Referring now to FIG. 18, therein is shown the structure of FIG. 17 after forming the first dielectric layer 200 and the second dielectric layer 202. The first dielectric layer 200 can be formed over or on the integrated circuit system 100 and the second dielectric layer 202 can be formed over or on the first dielectric layer 200. It is to be understood that the first dielectric layer 200 and the second dielectric layer 202 may include any of the characteristics, such as material composition, thickness, and process techniques, described above in regard to FIG. 10.

By way of example, in some embodiments, the first dielectric layer 200 may include a material with increased hydrogen concentration. In other embodiments, the first dielectric layer may include an oxide that has undergone a hydrogen treatment in a manner similar to the processes described in FIG. 5 above.

Additionally, in some embodiments, the second dielectric layer 202 may include a material with a density specifically engineered to prevent the out-gassing of hydrogen from the first dielectric layer 200. In other embodiments, the second dielectric layer 202 may preferably include a silicon nitride layer deposited by a RTCVD process, thereby increasing the density of the second dielectric layer 202.

Subsequent to forming the first dielectric layer 200 and the second dielectric layer 202 over the first device 108, the second device 900, and the resistance device 124, an anneal step can be performed to electrically activate the dopants within the first device 108 and the second device 900. It is to be understood that the anneal step may include any thermal process that electrically activates the dopants within the first device 108 and the second device 900, such as a rapid thermal anneal, a spike anneal and/or a laser anneal.

Unlike previous embodiments, the present embodiment performs the anneal before removing at least a portion of the second dielectric layer 202 from over the first region 102. Notably, the process of the present embodiment permits annealing without removal of the second dielectric layer, thereby eliminating process steps, while not adversely impacting the performance of a PFET device due to the orientation (e.g., a forty-five degree angle with respect to a standard [001] surface with a notch along <110>) of the substrate 106. Moreover, it is to be understood that the second dielectric layer 202 can still effectuate stress memorization transfer upon an NFET device and out-diffusion of dopants from within the resistance device 124, as described in previous embodiments.

Accordingly, the present inventors have discovered that by not removing the first dielectric layer 200 and the second dielectric layer 202 from over the integrated circuit system 100 that the resistance value of the resistance device 124 can be increased and that the performance of the first device 108 and the second device 900 can be improved. More particularly, the present inventors have discovered that by modulating the hydrogen concentration within the first dielectric layer 200 and/or by modulating the density of the second dielectric layer 202 that the resistance value of the resistance device 124 can be increased over that of resistors formed without the second dielectric layer 202 thereover. It is to be understood that an increased hydrogen concentration within the first dielectric layer 200 can help promote out-diffusion and deactivation of the dopant within the resistance device 124, thereby increasing the resistance of the resistance device 124. Moreover, it is to be understood that increasing the density of the second dielectric layer 202 can help block the out-gassing of hydrogen from the first dielectric layer 200, thereby helping to increase the resistance of the resistance device 124.

Accordingly, the present inventors have discovered a method for easily modulating the resistance of the resistance device 124 by altering the hydrogen concentration within the first dielectric layer 200 and by altering the density of the second dielectric layer 202 that does not require the additional processing steps of removing the second dielectric layer 202 from over one or more of the first device 108 and/or the second device 900 before annealing.

Figure 19:
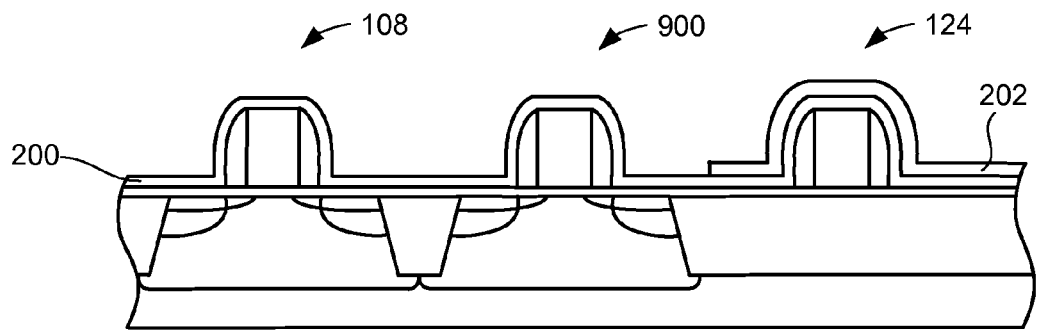
FIG. 19 is the structure of FIG. 18 after removing a second dielectric layer from over a first device and a second device.

Referring now to FIG. 19, therein is shown the structure of FIG. 18 after removing the second dielectric layer 202 from over the first device 108 and the second device 900. In some embodiments, the second dielectric layer 202 can be removed from over the first device 108 and the second device 900 by forming and processing a mask layer (not shown) to expose the first device 108 and the second device 900. In such cases, the first dielectric layer 200 remains over the first device 108, the second device 900 and the resistance device 124, while the second dielectric layer 202 remains intact over the resistance device 124.

Subsequent to patterning the mask layer, the exposed portion of the second dielectric layer 202 formed over the first device 108 and the second device 900 can be etched by methods selective to the composition of the second dielectric layer 202. Generally, the second dielectric layer 202 can be etched by common gas chemistries such as $CF_4$, $SiF_4$, $NF_3$, $CHF_3$ and $C_2F_6$. However, it is to be understood that the type of gas chemistry used to etch the second dielectric layer 202 is not essential, what is important is that the second dielectric layer 202 is removed from over the first device 108 and the second device 900 after etching.

Notably, the process of the present embodiment helps to eliminate previously necessary processing steps, such as the entire removal of the second dielectric layer 202 after a stress memorization anneal and formation and etching of an another one of the second dielectric layer 202 to block silicidation of the resistance device 124.

Figure 20:
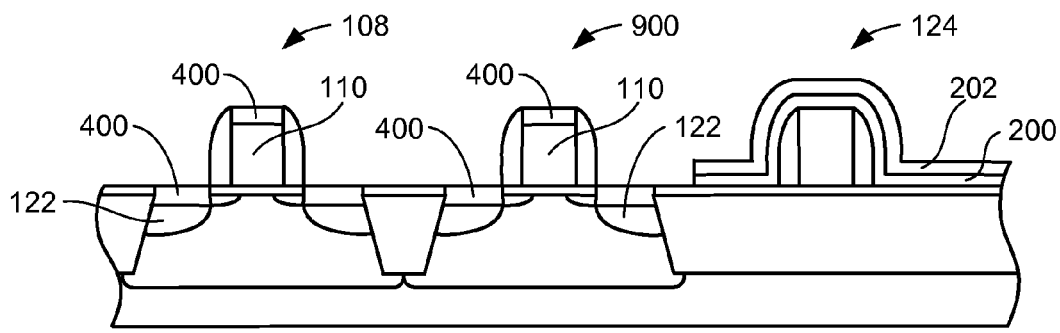
FIG. 20 is the structure of FIG. 19 after removing a first dielectric layer from over a first device and a second device.

Referring now to FIG. 20, therein is shown the structure of FIG. 19 after removing the first dielectric layer 200 from over the first device 108 and the second device 900. In some embodiments, the first dielectric layer 200 can be removed from over the first device 108 and the second device 900 in a manner similar to the processes described in reference to FIG. 12 above. Subsequent to removing the first dielectric layer 200 from over the first device 108 and the second device 900, the electrical contact 400, such as a low resistance silicide or salicide electrical contact, can be formed over the gate 110 and the source/drain 122 of the first device 108 and the second device 900 by processes well known within the art for forming the electrical contact 400. It is to be understood that the first dielectric layer 200 and the second dielectric layer 202 remaining over the resistance device 124 prevents and/or blocks the deposition of a low resistance silicide electrical contact, thereby preventing a lowering of the resistance of the resistance device 124.

In general, the above process steps form a high resistance resistor by blocking the formation of a silicide contact from forming on the resistance device 124 and by removing dopants from the resistance device 124. In some embodiments, the resistance device 124 formed by the above process steps may include a high resistance resistor, such as one with a sheet resistance value exceeding 500 ohms/square. In other embodiments, the resistance device 124 may include a high resistance resistor with a sheet resistance value varying between about 750 ohms/square to about 775 ohms/square. Moreover, it is to be understood that the performance of active devices within the first region 102 can be improved due to the application of a stress memorization transfer process.

Figure 21:
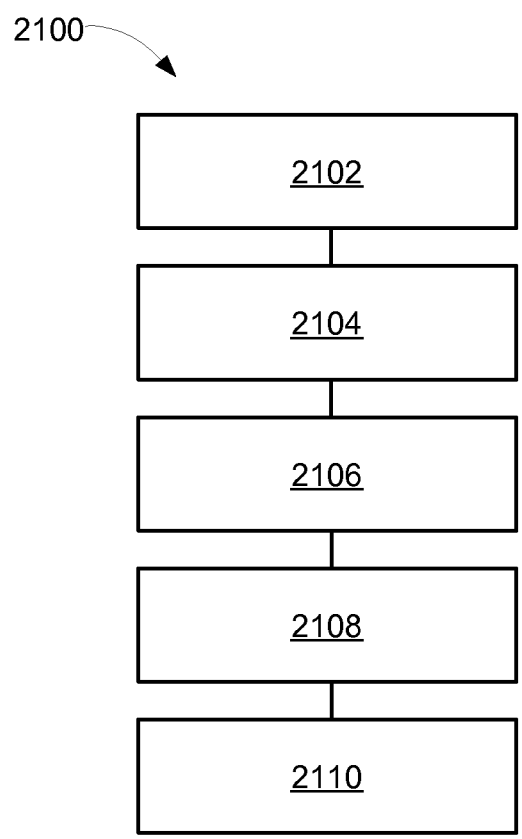
FIG. 21 is a flow chart of an integrated circuit system for an integrated circuit system, in accordance with an embodiment of the present invention.

Referring now to FIG. 21, therein is shown a flow chart of an integrated circuit system 2100 for the integrated circuit system 100, in accordance with an embodiment of the present invention. The integrated circuit system 2100 includes providing a substrate including a first region and a second region in a block 2102; forming a first device over the first region and a resistance device over the second region in a block 2104; forming a first dielectric layer and a second dielectric layer over the substrate in a block 2106; removing a portion of the second dielectric layer in a block 2108; and annealing the integrated circuit system to remove dopant from the resistance device in a block 2110.

It has been discovered that the present invention thus has numerous aspects. One such aspect is that the present invention improves the performance of an active device by utilizing stress memorization transfer techniques.

Another aspect is that the present invention can increase the resistance value of a resistor by employing a strategically engineered dielectric layer to prevent hydrogen out-gassing.

Another aspect is that the present invention can increase the resistance value of a resistor by altering the density of a strategically engineered dielectric layer to prevent hydrogen out-gassing.

Another aspect is that the present invention can increase the resistance value of a resistor by forming a strategically engineered dielectric layer with increased hydrogen concentration.

Another aspect is that the present invention can increase the resistance value of a resistor by forming a strategically engineered dielectric layer with increased hydrogen concentration via a hydrogen treatment process.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit system of the present invention furnishes important and heretofore unknown and unavailable solutions, capabilities, and functional aspects for forming an integrated circuit system including a high resistance resistor and enhanced active device performance. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacture of an integrated circuit system comprising:
   providing a substrate including a first region and a second region;
   forming a first device over the first region, the first device having a first gate over a first gate dielectric;
   forming a resistance device over the second region, the resistance device having a second gate over a second gate dielectric similar to the first gate and the first gate dielectric of the first device;
   forming a first dielectric layer and a second dielectric layer over the substrate wherein forming the second dielectric layer includes increasing the density of the second dielectric layer to increase a resistance value of the resistance device;

removing a portion of the second dielectric layer; and
annealing the integrated circuit system to remove dopant from the resistance device.

2. The method as claimed in claim 1 wherein:
forming the first dielectric layer includes forming an oxide and forming the second dielectric layer includes forming a nitride.

3. The method as claimed in claim 1 wherein:
removing a portion of the second dielectric layer includes removing the second dielectric layer from over the first device.

4. The method as claimed in claim 1 wherein:
annealing the integrated circuit system includes forming the resistance device with a sheet resistance value between about 700 ohms/square to about 900 ohms/square.

5. The method as claimed in claim 1 wherein:
increasing the density of the second dielectric layer includes forming the second dielectric layer by rapid thermal chemical vapor deposition.

6. A method of manufacture of an integrated circuit system comprising:
providing a substrate including a first region and a second region;
forming a first device over the first region, the first device having a first gate over a first gate dielectric;
forming a resistance device over the second region, the resistance device having a second gate over a second gate dielectric similar to the first gate and the first gate dielectric of the first device;
forming a first dielectric layer over the substrate;
processing the first dielectric layer with a hydrogen treatment;
forming a second dielectric layer over the first dielectric layer wherein forming the second dielectric layer includes increasing the density of the second dielectric layer to increase a resistance value of the resistance device;
removing a portion of the second dielectric layer; and
annealing the integrated circuit system to remove dopant from the resistance device.

7. The method as claimed in claim 6 wherein:
processing the first dielectric layer with a hydrogen treatment includes utilizing a hydrogen forming gas anneal.

8. The method as claimed in claim 6 wherein:
processing the first dielectric layer with a hydrogen treatment includes utilizing a hydrogen plasma treatment.

9. The method as claimed in claim 6 wherein:
forming the second dielectric layer over the first dielectric layer prevents deposition of an electrical contact over the resistance device.

10. The method as claimed in claim 6 wherein:
increasing the density of the second dielectric layer includes forming the second dielectric layer by rapid thermal chemical vapor deposition.

11. A method of manufacture of an integrated circuit system comprising:
providing a substrate including a first region and a second region;
forming a first device and a second device over the first region, the first device having a first gate over a first gate dielectric;
forming a resistance device over the second region, the resistance device having a second gate over a second gate dielectric similar to the first gate and the first gate dielectric of the first device;
forming a first dielectric layer and a second dielectric layer over the substrate wherein forming the second dielectric layer includes increasing the density of the second dielectric layer to increase a resistance value of the resistance device;
removing a portion of the second dielectric layer; and
annealing the integrated circuit system to remove dopant from the resistance device.

12. The method as claimed in claim 11 wherein:
forming the first dielectric layer includes forming an oxide and forming the second dielectric layer includes forming a nitride.

13. The method as claimed in claim 11 wherein:
removing a portion of the second dielectric layer includes removing the second dielectric layer from over the first region.

14. The method as claimed in claim 11 wherein:
removing a portion of the second dielectric layer includes removing the second dielectric layer from over the second device or removing the second dielectric layer from over the first device and the second device.

15. The method as claimed in claim 11 wherein:
removing a portion of the second dielectric layer includes removing the second dielectric layer from over the first region either before annealing or after annealing.

16. The method as claimed in claim 11 wherein:
annealing the integrated circuit system includes a stress memorization transfer process.

17. The method as claimed in claim 11 wherein:
providing the substrate includes providing the substrate with a crystalline plane that is rotated about forty-five degrees.

18. The method as claimed in claim 11 further comprising:
processing the first dielectric layer with a hydrogen treatment.

19. The method as claimed in claim 11 wherein:
increasing the density of the second dielectric layer includes forming the second dielectric layer by rapid thermal chemical vapor deposition.

20. The method as claimed in claim 11 further comprising:
forming an electrical contact over the first gate and a source/drain of the first device and the second device.

* * * * *